(12) United States Patent
Gatterbauer et al.

(10) Patent No.: US 9,875,978 B2
(45) Date of Patent: Jan. 23, 2018

(54) SEMICONDUCTOR CHIP DEVICE

(71) Applicant: Infineon Technologies AG, Neubiberg (DE)

(72) Inventors: Johann Gatterbauer, Parsberg (DE); Bernhard Weidgans, Bernhardswald (DE); Dietrich Bonart, Bad Abbach (DE); Thomas Gross, Sinzing (DE); Martina Debie, Bogen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/292,219

(22) Filed: Oct. 13, 2016

(65) Prior Publication Data

US 2017/0110423 A1   Apr. 20, 2017

Related U.S. Application Data

(63) Continuation of application No. 14/884,869, filed on Oct. 16, 2015, now Pat. No. 9,502,248.

(51) Int. Cl.
*H01L 29/40* (2006.01)
*H01L 23/00* (2006.01)

(52) U.S. Cl.
CPC .............. *H01L 24/05* (2013.01); *H01L 24/03* (2013.01); *H01L 2224/05082* (2013.01); *H01L 2224/05084* (2013.01); *H01L 2224/05124* (2013.01); *H01L 2224/05139* (2013.01); *H01L 2224/05144* (2013.01); *H01L 2224/05147* (2013.01); *H01L 2224/05164* (2013.01); *H01L 2224/05166* (2013.01); *H01L 2224/05169* (2013.01); *H01L 2224/05171* (2013.01)

(58) Field of Classification Search
CPC ................................ H01L 24/05; H01L 24/03
USPC ......................................................... 257/664
See application file for complete search history.

(56) References Cited

U.S. PATENT DOCUMENTS 5,124,275 A * 6/1992 Selle ................... H01L 21/0272
                                                148/DIG. 100
9,633,957 B2 * 4/2017 Hilsenbeck ............. H01L 24/05

* cited by examiner

*Primary Examiner* — David S Blum
(74) *Attorney, Agent, or Firm* — Viering, Jentschura & Partner mbB

(57) ABSTRACT

According to various embodiments, a method may include: forming a first layer on a surface using a first lift-off process; forming a second layer over the first layer using a second lift-off process; wherein the second lift-off process is configured such that the second layer covers at least one sidewall of the first layer at least partially.

17 Claims, 6 Drawing Sheets

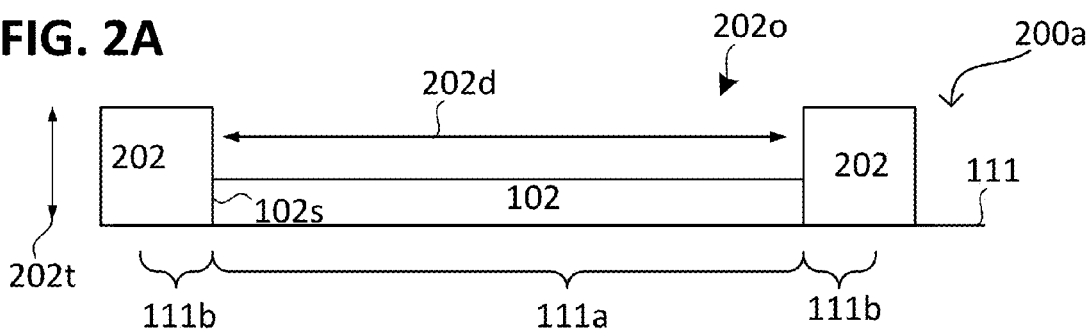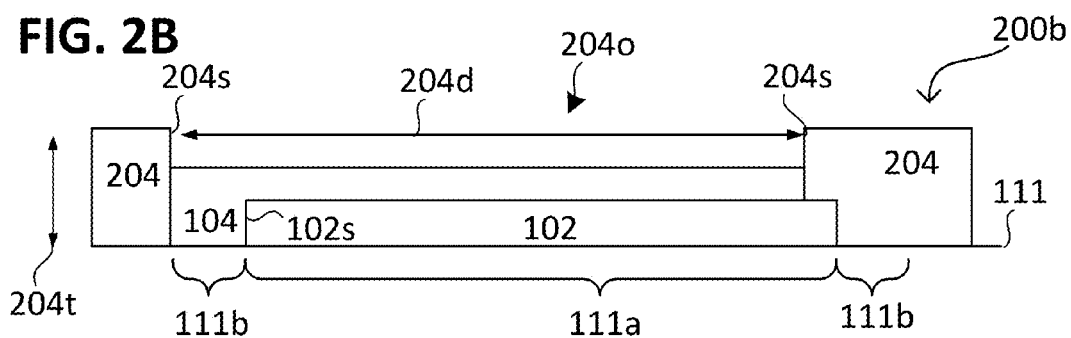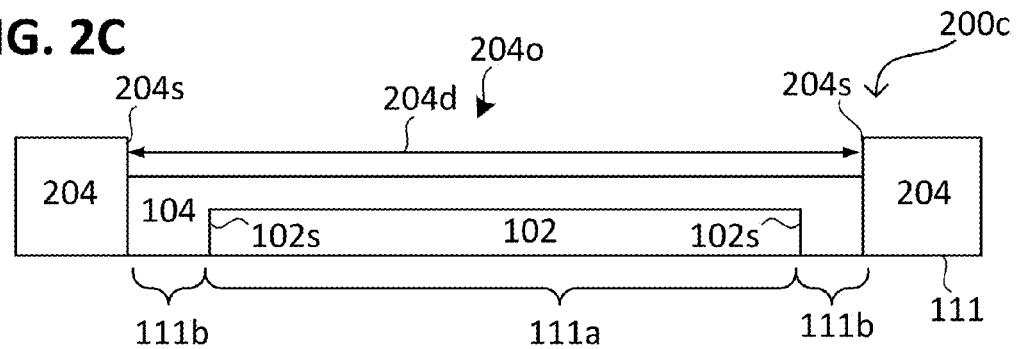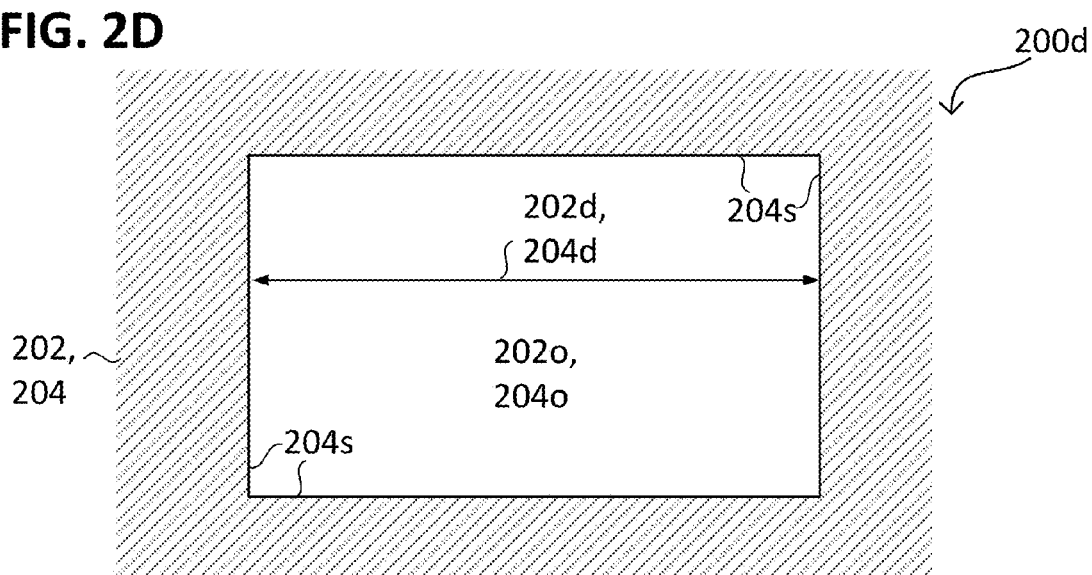

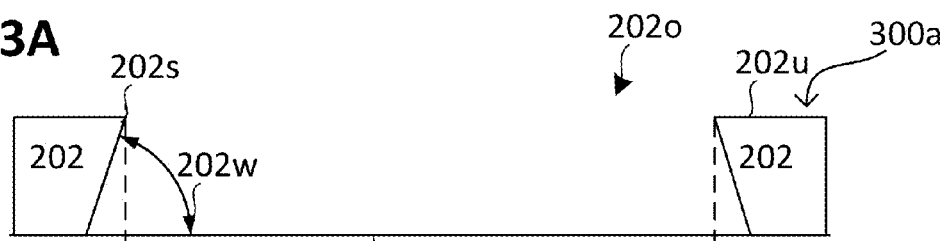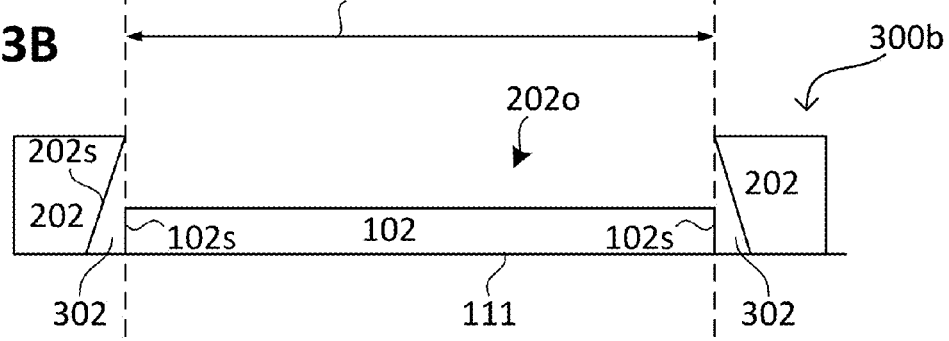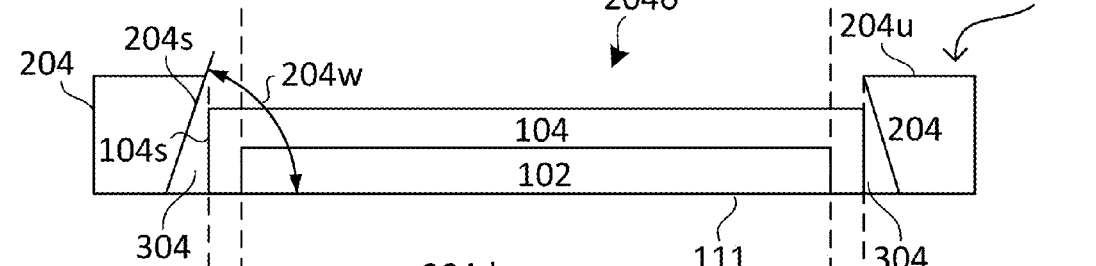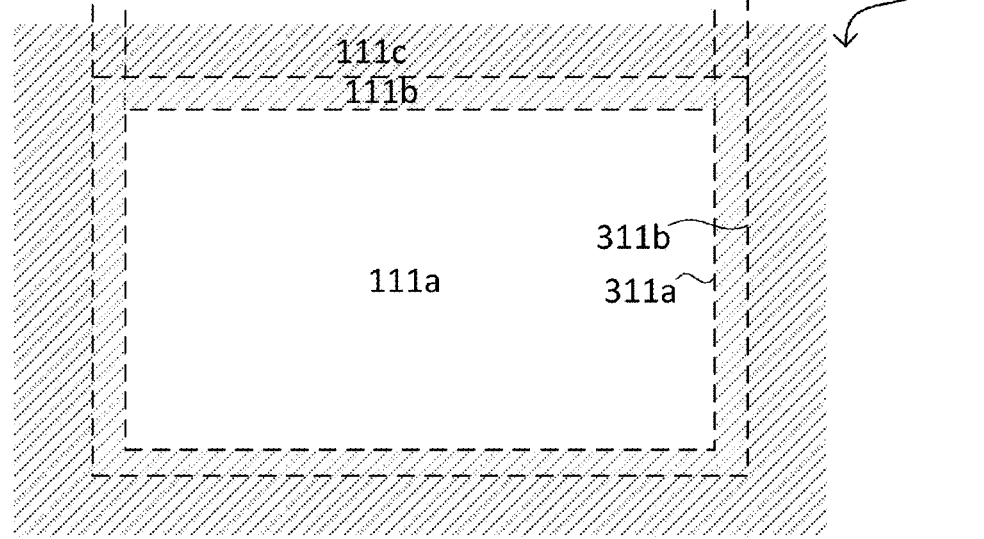

SEMICONDUCTOR CHIP DEVICE

RELATED APPLICATION(S)

This application is a continuation of U.S. patent application Ser. No. 14/884,869, Now U.S. Pat. No. 9,502,248, entitled "METHODS FOR MAKING A SEMICONDUCTOR CHIP DEVICE" and filed on Oct. 16, 2015, the contents of which are incorporated herein by reference.

TECHNICAL FIELD

Various embodiments relate generally to a method and a semiconductor chip device.

BACKGROUND

In general, a microelectronic device, e.g. a semiconductor device, may be processed in microfabrication technology, e.g. in semiconductor technology, on and/or in a substrate (also referred to as a wafer or a carrier). The substrate may include a plurality of microelectronic devices, e.g. chips, which are processed or mounted in corresponding regions of the substrate. For fabricating such semiconductor devices, certain electrical contact structures are provided by forming layers and layer stacks, e.g. for electrical interconnections between at least two microelectronic devices or between at least one microelectronic devices and the substrate (e.g. a printed circuit board).

Conventionally, for forming layers and layer stacks a broad variety of materials is processed, e.g. structured, e.g. by etching. However, materials which are processable by etching are also vulnerable regarding environmental influences, e.g. during further process steps, and tend to deteriorate, e.g. by oxidation. The deterioration may impair the functionality of the layers, e.g. their capability for providing electrical connections. Therefore, environmental resistant protection layers may be used for protecting the vulnerable layers against environmental influences. However, materials which provide a high environmental resistance are hard to process by etching due to their high resistance and protection qualities. This complicates the fabrication processes and increases the number of process steps necessary to form the respective layer stacks. Illustratively, the materials usable for protection are also resistant against a wide range of processing technologies.

On order to avoid etching, a layer is deposited on a structured mask which is used as sacrificial layer and removed together with the unwanted parts of the layer (also referred to as lift-off process). However, the lift-off process limits the thickness of the layer due to the limited mask thickness. The limited thickness of the layer impairs its capability to provide a stable electrical contact, e.g. using soldering. Illustratively, the lift-off processed layer is too thin to provide a stable electrical contact. Therefore this technique is limited in providing suitable protection layers for electrical contacts.

SUMMARY

According to various embodiments, a method may include: forming a first layer on a surface using a first lift-off process; forming a second layer over the first layer using a second lift-off process; wherein the second lift-off process is configured such that the second layer covers at least one sidewall of the first layer at least partially.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2A, FIG. 2B and FIG. 2C respectively show a layer stack in a method according to various embodiments in a schematic cross sectional view or schematic side view;

FIG. 2D shows a layer stack in a method according to various embodiments in a schematic cross sectional view or schematic top view;

FIG. 3A, FIG. 3B and FIG. 3C respectively show a layer stack in a method according to various embodiments in a schematic cross sectional view or schematic side view;

FIG. 3D shows a layer stack in a method according to various embodiments in a schematic cross sectional view or schematic top view;

DESCRIPTION

Figure 1A:
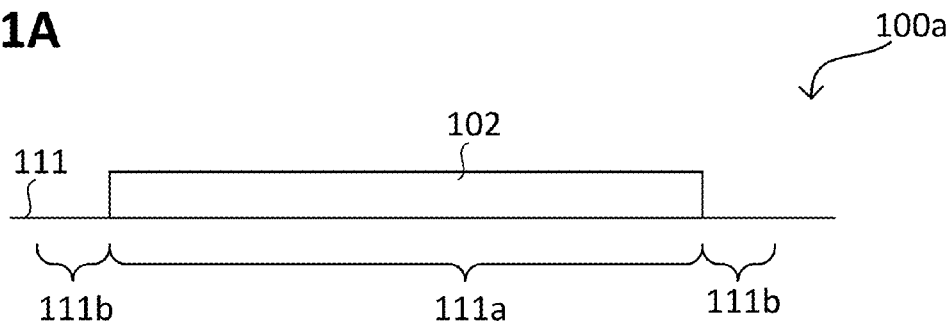
FIG. 1A, FIG. 1B and FIG. 1C respectively show a layer stack in a method according to various embodiments in a schematic cross sectional view or schematic side view.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a carrier) or "laterally" next to, may be used herein to mean an extension or a positional relationship along a surface of a substrate, a wafer, or a carrier. That means that a surface of a substrate (e.g. a surface of a carrier, or a surface of a wafer) may serve as reference, commonly referred to as the main processing surface of the substrate (or the main processing surface of the carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

According to various embodiments, a double (or multiple) lift-off technique is provided. The double (or multiple) lift-off technique results in a contact pad metallization which is, illustratively, good adhered to the underlying surface, corrosion resistant (due to the encasement), solderable and bondable. Due to the double (or multiple) lift-off, the thickness limitation of a single lift-off process is eliminated. This gives an improved process window for interconnect techniques. Optionally, the double (or multiple) lift-off may result in a reduced crystal size, e.g. in case of processing different materials, which may increase the mechanical stability.

According to various embodiments, in a first lift-off process (e.g. a first lift-off lithography) a (for example, pure) gold layer and at least one of a titanium barrier layer and a platinum barrier layer is processed. The resulting first layer stack (titanium/platinum/gold) enables good adhesion as well as good thermal and electrical conductivity. Using a second lift-off process (e.g. a second lift-off lithography) a (for example, pure) gold layer can be applied, e.g. formed over the gold layer of the first layer stack provided by the first lift-off. Illustratively, the second lift-off process may provide a corrosion resistant encasement of the first layer stack, e.g. by covering substantially all exposed surfaces of the first layer stack.

At least one of the first lift-off process and the second lift-off process (in other words, the first lift-off process and/or the second lift-off process) can be applied to other noble elements (noble metals), e.g. noble elements which do not form an intermediate layer (e.g. metal oxides) that influence the electrical and thermal properties. The second lift-off process is configured such (in other words includes dimensions in a way) that the first layer stack (e.g. metal stack) is completely (fully) covered using the second lift-off process. Based on the material for the individual layers formed using at least one of the first lift-off process and the second lift-off process the resulting layer stack is resistive against chemical attack arising from other (e.g. subsequent) process steps as well as against corrosive (reactive) elements from the atmosphere. The sequence including at least one of the first lift-off process and the second lift-off process can be repeated (also referred to as further lift-off process), e.g. one or more times (for example, several times) if needed, e.g. two, three, four or more than four times. In other words, one, two, three, four or more than four further (e.g. single or double) lift-off process may be applied.

According to various embodiments, a lift-off process includes forming a sacrificial layer (e.g. which may include or be formed from a polymer, e.g. photoresist or another resist) over a surface; structuring the sacrificial layer to provide a mask structure; forming a layer over the mask structure (and the surface); removing the mask structure such that at least one portion of the layer remains over the surface. Illustratively, when the mask structure is removed (e.g. using a mask removing agent, e.g. including at least one of a solvent and an etchant) portions of the layer which are separated from the substrate by the mask structure are lifted-off and removed together with the mask structure below. After the lift-off process, the at least one portion of the layer may remain over regions of the surface which were exposed by the mask structure, e.g. in which the layer and the surface are in physical contact with each other. Illustratively, the at least one portion of the layer remaining over the surface includes an inverted structure of the mask structure.

Optionally, further layers may be formed over the mask structure (and the surface) before removing the mask structure. In this context, the lift-off process may include forming a layer stack over the mask structure (and the surface) and removing the mask structure such that at least one portion of the layer stack remains over the surface. The layer stack may include at least two (two or more) layers.

Structuring may include forming one or more openings into (e.g. through) the sacrificial layer (in other words, opening the sacrificial layer) to expose the (underlying) surface, e.g. one or more regions of the surface. The one or more openings may be formed by removing material of the sacrificial layer, e.g. using etching, over the one or more regions of the surface. The structuring may also referred to as inverse structuring, since the one or more openings may define the regions in which material of overlaying layers may remain. The one or more openings may be surrounded, e.g. separated from from each other, by a wall of the mask structure. Forming the layer over the mask structure may include forming a first portion of the layer over a wall of the mask structure and forming a second portion of the layer in the one or more openings. The first portion of the layer may be removed with the mask structure and the second portion of the layer may remain over the surface. Forming the layer over the mask structure may include covering the mask structure at least partially (in other words, partially or completely) with the layer.

FIG. 1A illustrates a layer stack in a method according to various embodiments in a schematic cross sectional view or schematic side view (e.g. in a view direction parallel to the surface 111). The method may include in a first step 100a forming a first layer 102 over a surface 111. The first layer 102 may be formed using a first lift-off process. The first lift-off process may be configured such that the first layer 102 is formed over a first region 111a of the surface 111, wherein a second region 111b of the surface 111 may remain free (in other words, uncovered) from the first layer 102. The second region 111b of the surface 111 may surround the first region 111a of the surface 111. The first layer 102, e.g. its material, may be deposited by a physical vapor deposition, e.g. sputtering, plasma deposition or thermal evaporation. The first lift-off process may define the shape and thickness of the first layer 102.

Alternatively, the first layer 102 may be formed using another process (different from a lift-off process), including deposing the first layer 102, e.g. by a physical vapor deposition or a chemical vapor deposition, and structuring the first layer 102, e.g. using etching. In other words, the first layer 102 may be formed using a structuring process. Deposing the first layer 102 may include covering the surface 111, e.g. deposing first layer 102 at least over the first region 111a of the surface 111 and the second region 111b of the surface 111. Structuring the first layer 102 may include removing the first layer 102 over the second region 111b of the surface 111, e.g. using etching. In other words, forming the first layer 102 may include structuring the first layer 102 to remove a portion of the first layer 102 over the second region 111b. Etching may include or be formed from at least one of dry etching, plasma etching, and wet etching.

The surface 111 may include or be formed from at least one of: a semiconductor material, a polymer material, and a metal. For example, the surface 111 may be part of a substrate, e.g. a semiconductor substrate or a printed circuit board. The substrate may include one or more circuit structures, e.g. integrated circuits (also referred to as chip), e.g. wherein a circuit structure may provide the surface 111. Alternatively or additionally, the substrate may include one or more metallization layers for electrical interconnection, e.g. wherein a metallization layer may provide the surface 111. The first layer 102 may be formed over, e.g. in electrical contact to the one or more metallization layers.

Figure 1B:
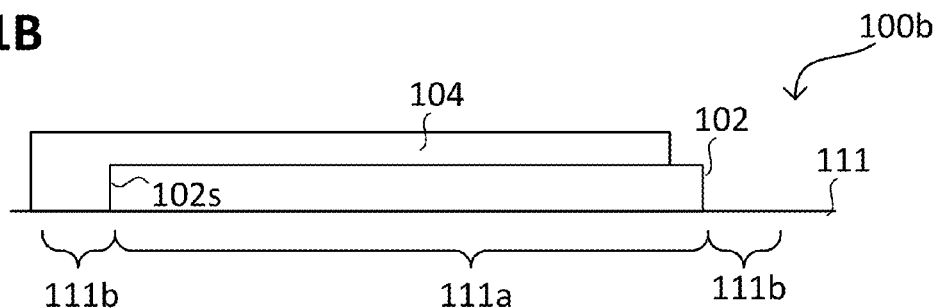

FIG. 1B illustrates a layer stack in a method according to various embodiments in a schematic cross sectional view or schematic side view. The method may include in a second step 100b forming a second layer 104 over the surface 111. The second layer 104 may be formed using a second lift-off process. The second lift-off process may be configured such that the second layer 102 is formed at least over the first region 111a of the surface 111 (e.g. at least partially) and over the second region 111b of the surface 111 (e.g. at least partially). The second layer 104 may be formed using a physical vapor deposition, e.g. sputtering or thermal evaporation.

Alternatively, the second layer 104 may be formed using another process (similar to the first layer 102), including structuring the second layer 104. Deposing the second layer 104 may include covering the surface 111, e.g. deposing second layer 104 at least over the first region 111a of the surface 111, the second region 111b of the surface 111 and a third region of the surface 111 surrounding the second region 111b of the surface 111. Structuring the second layer 104 may include removing the second layer 104 at least from the third region of the surface 111, e.g. using etching.

The second layer 104 may be formed such that the second layer 104 layer covers at least one sidewall 102s of the first layer 102 (e.g. in a lateral direction). Therefore, a lateral extension of the second layer 104 may be greater than a lateral extension of the first layer 102. In other words, the second layer 104 may extend over the first layer 102 in a lateral direction, on at least one lateral side of the first layer 102. In other words, the second layer 104 may overlap the at least one sidewall 102s of the first layer 102 at least partially. The at least one sidewall 102s of the first layer 102 may extend away from the surface 111, e.g. at least partially into a vertical direction.

The first layer 102 may not completely be covered by the second layer 104. In other words, the first layer 102 may be partially exposed. The exposed parts may, for example, remain from process in homogeneities. Alternatively, e.g. if needed, forming the second layer 104 may be configured such that at least one portion of the first layer 111 remains free of the second layer 104.

According to various embodiments, at least one further layer may be formed at least one of between the surface 111 and the second layer 104, and over the second layer 104, as described in the following. The at least one further may be formed using a further lift-off process, e.g. similar to at least one of the first lift-off process and the second lift-off process, e.g. if at least one of the first layer 102 and the second layer 104 may be formed using another process.

Figure 1C:
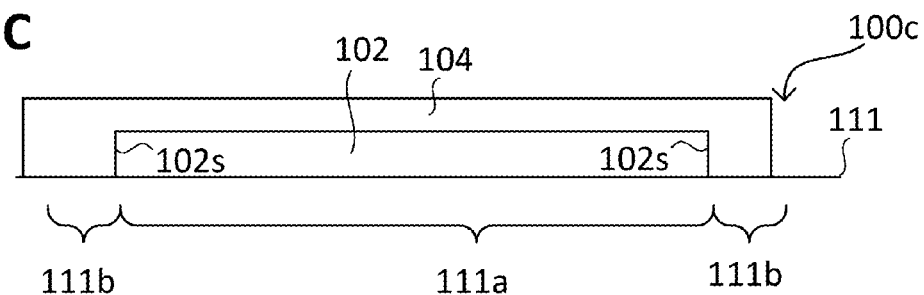

FIG. 1C illustrates a layer stack in a method according to various embodiments in a schematic cross sectional view or schematic side view in a second step 100c similar to the second step 100b illustrated in FIG. 1B. In this case, the second layer 104 may be formed such that the second layer 104 layer covers more than one sidewall 102s of the first layer 102, e.g. all sidewalls 102s of the first layer 102. In other words, the second layer 104 layer may cover a perimeter sidewall of the first layer 102. In other words, the second layer 104 may extend over the first layer 102 in a lateral direction at least on two lateral sides of the first layer 102, e.g. opposite lateral sides. In other words, the second layer 104 may overlap the more than one sidewall 102s of the first layer 102 (e.g. at least on opposite sides). The first layer 102 may be encased into the second layer 104 and the surface 111.

Figure 1D:
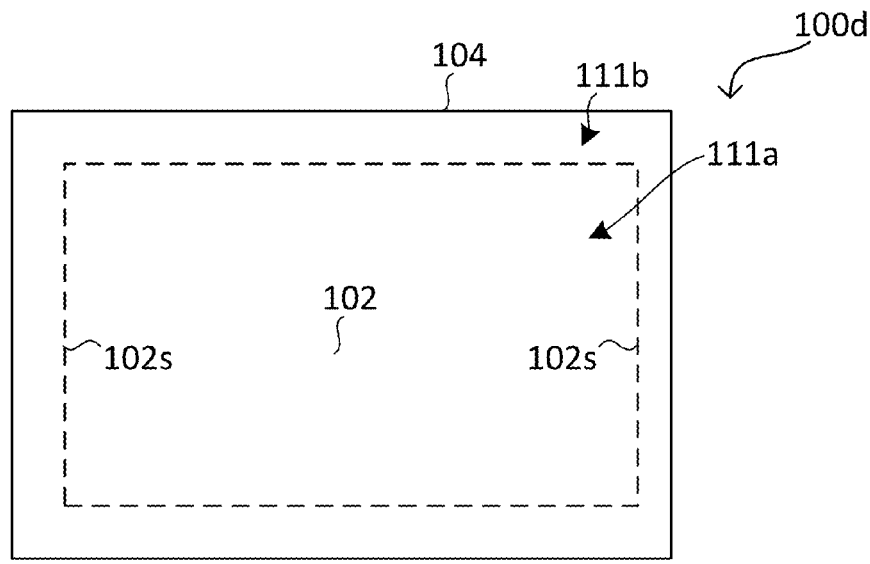
FIG. 1D shows a layer stack in a method according to various embodiments in a schematic cross sectional view or schematic top view.

FIG. 1D illustrates a layer stack 100d, e.g. the layer stack of the second step 100c illustrated in FIG. 1C, in a method according to various embodiments in a schematic cross sectional view or schematic top view (e.g. in view direction perpendicular to the surface 111). As illustrated in FIG. 1D, the first layer 102 may include at least one sidewall 102s (e.g. illustratively, surrounding the first layer 102) which is covered by the second layer 104. The at least one sidewall 102s may extend from an interface (dashed line) of the first region 111a of the surface 111 and the second region 111b of the surface 111 into a direction away from the surface, e.g. at least partially into a vertical direction.

FIG. 2A illustrates a layer stack in a method according to various embodiments in a schematic cross sectional view or schematic side view (e.g. in a view direction parallel to the surface 111) during a first lift-off process 200a. The first lift-off process 200a may include forming a first mask structure 202. The first mask structure 202 may include a first opening 202o (or more than one first opening 202o) extending through the first mask structure 202. The first opening 202o may expose the surface 111 partially, e.g. at least the first region 111a of the surface 111. The first mask structure 202 may cover at least the second region 111b of the surface 111. The first layer 102 may be formed in the first opening 202o. After forming the first layer 102, the first mask structure 202 may be removed, e.g. together with portions of the first layer 102 which extend over the first opening 202o, e.g. over the first region 111a of the surface 111.

The first opening 202o may include a first extension 202d (e.g. parallel to the surface 111). The first extension 202d may be illustratively understood as width (e.g. as diameter if the first opening 202o has a round shape). The first extension 202d may be perpendicular to a first thickness 202t of the first mask structure 202. The first layer 102 may include a lateral extension (e.g. after removing the first mask 202) equal to or less than the first extension 202d. The first layer 102 may include a thickness (e.g. perpendicular to the lateral extension of the first layer 102) less than the first thickness 202t of the first mask structure 202. According to various embodiments, the first extension 202d may be in the range from about 5 μm to about 200 μm, e.g. in the range from about 10 μm to about 150 μm, e.g. in the range from about 50 μm to about 100 μm. The first thickness 202t may be in the range from about 1 μm to about 5 nm.

FIG. 2B illustrates a layer stack in a method according to various embodiments in a schematic cross sectional view or schematic side view during a second lift-off process 200*b*. The second lift-off process 200*b* may include forming a second mask structure 204. The second mask structure 204 may include a second opening 204*o* extending through the second mask structure 204. The second opening 204*o* may expose the first layer at least partially, e.g. at least partially over the first region 111*a* of the surface 111, and may expose the second region 111*b* of the surface 111 at least partially. The second mask structure 204 may cover a third region of the surface 111 surrounding the second region 111*b* of the surface 111. The second layer 104 may be formed in the second opening 204*o*. After forming the second layer 104, the second mask structure 204 may be removed, e.g. together with portions of the second layer 104 which extend over the second opening 204*o*, e.g. over the second region 111*b* of the surface 111.

The second opening 204*o* may include a second extension 204*d* (e.g. parallel to the surface 111). The second extension 204*d* may be illustratively understood as width (e.g. as diameter if the second opening 204*o* has a round shape). The second extension 204*d* may be perpendicular to a second thickness 204*t* of the second mask structure 204. The second layer 104 may include a lateral extension (e.g. after removing the second mask 204) equal to or less than the second extension 204*d*. The second layer 104 may include a thickness (e.g. perpendicular to the lateral extension of the second layer 104) less than the second thickness 204*t* of the second mask structure 204. According to various embodiments, the second extension 204*d* may be in the range from about 5 µm to about 200 µm, e.g. in the range from about 10 µm to about 150 µm, e.g. in the range from about 50 µm to about 100 µm. The second thickness 204*t* may be different from the first thickness 202*t*, e.g. greater than the first thickness 202*t*. The second thickness 204*t* may be in the range from about 1 µm to about 5 µm.

FIG. 2C illustrates a layer stack in a method according to various embodiments in a schematic cross sectional view or schematic side view during a second lift-off process 200*c* similar to the second lift-off process 200*b* illustrated in FIG. 2B. The second opening 204*o* may expose the first layer (completely) and may expose the second region 111*b* of the surface 111. The second mask structure 204 may cover a third region of the surface 111 surrounding the second region 111*b* of the surface 111.

According to various embodiments, the second extension 204*d* may be different from the first extension 202*d*, e.g. greater than the first extension 202*d*. According to various embodiments, the second extension 204*d* may be greater than the lateral extension of the first layer 102.

According to various embodiments, the second opening 204*o* may expose at least one sidewall 102*s* of the first layer 102 (before forming the first layer 102 in the opening), e.g. at least two sidewalls 102*s* of the first layer 102. The second mask structure 204 may be configured such, that at least one sidewall 204*s* of the second opening 204*o* may be disposed distant from the first layer 102, e.g. from at least one sidewall 102*s* of the first layer 102 (e.g. at least on one side), e.g. from at least two sidewalls 102*s* of the first layer 102 (e.g. at least on opposite sides).

FIG. 2D shows a layer stack in a method according to various embodiments in a schematic cross sectional view or schematic top view (e.g. in a view direction perpendicular to the surface 111, e.g. in a projection on the surface 111) in a step 200*d* during at least one of a first lift-off process 200*a* and the second lift-off process 200*b*, 200*c*. At least one of the first opening 202*o* and the second opening 204*o* (in other words, at least one of the first opening 202*o* and the second opening 204*o*) may be surrounded by material of the first mask structure 202 or the second mask structure 204, respectively.

FIG. 3A illustrates a layer stack in a method according to various embodiments in a schematic cross sectional view or schematic side view (e.g. in a view direction parallel to the surface 111) during a first step 300*a* of a first lift-off process similar to the first lift-off process 200*a* illustrated in FIG. 2A. As illustrated in FIG. 3A the method may include forming a first mask structure 202 including at least one sidewall 202*s* of the first opening 202*o*. The at least one sidewall 202*s* of the first opening 202*o* may be inclined with respect to the surface 111 by a first angle 202*w* in the range from about 70° to about 85°, e.g. in the range from about 75° to about 80°. The first extension 202*d* may be defined at a top surface 202*u* of the first mask structure 202, wherein the top surface 202*u* of the first mask structure 202 is opposite the surface 111.

FIG. 3B illustrates a layer stack in a method according to various embodiments in a schematic cross sectional view or schematic side view (e.g. in a view direction parallel to the surface 111) during a second step 300*b* of the lift-off process illustrated in FIG. 3A. The method may include forming a first layer 104 in the first opening 202*o*. The lateral extension of the first layer 102 may be defined by the first extension 202*d*. Due to the inclined at least one sidewall 202*s* of the first opening 202*o*, there may be a first gap 302 (e.g. having a substantially triangular cross section) remaining between the first layer 102, e.g. the sidewall 102*s* of the first layer 102, and the at least one sidewall 202*s* of the first opening 202*o*. The first gap 302 may surround the first layer 102 at least partially (in other words, partially or completely). The first gap 302 may result in that substantially no material of the first layer 102 is deposited on the at least one sidewall 202*s* of the first opening 202*o*. In other words, the at least one sidewall 202*s* of the first opening 202*o* may be substantially free from material of the first layer 102.

After the first layer 102 is formed, the first mask structure 202 may be removed using a mask removing agent. Since the at least one sidewall 202*s* of the first opening 202*o* is substantially free from material of the first layer 102 the mask removing agent may affect the first mask structure 202 from inside the first opening 202*o*, e.g. also on the at least one sidewall 202*s* of the first opening 202*o*. Therefore, errors, e.g. arising from remaining material from the first mask structure 202, may be reduced, e.g. may be avoided.

FIG. 3C illustrates a layer stack in a method according to various embodiments in a schematic cross sectional view or schematic side view (e.g. in a view direction parallel to the surface 111) in a step 300*c* of a second lift-off process similar to the second lift-off process 200*c* illustrated in FIG. 2C. As illustrated in FIG. 3C the method may include forming a second mask structure 204 including at least one sidewall 204*s* of the second opening 204*o*. The at least one sidewall 204*s* of the second opening 204*o* may be inclined with respect to the surface 111 by a second angle 204*w* in the range from about 70° to about 85°, e.g. in the range from about 75° to about 80°. The second extension 204*d* may be defined at a top surface 204*u* of the second mask structure 204, wherein the top surface 204*u* of the second mask structure 204 is opposite the surface 111.

The method may further include forming a second layer 104 in the second opening 204*o*. The lateral extension of the second layer 104 may be defined by the second extension 204*d*. Due to the inclined at least one sidewall 204*s* of the second opening 204o, there may be a second gap 304 remaining between the second layer 104, e.g. at least one sidewall 104s of the second layer 104, and the at least one sidewall 204s of the second opening 204o. The second gap 304 may surround the second layer 104 at least partially (in other words, partially or completely). The second gap 304 may result in that substantially no material of the second layer 104 is deposited on the at least one sidewall 204s of the second opening 204o. In other words, the at least one sidewall 204s of the second opening 204o may be substantially free from material of the second layer 104.

After the second layer 104 may be formed, the second mask structure 204 may be removed, e.g. using a mask removing agent. Since the at least one sidewall 204s of the second opening 204o is substantially free from material of the second layer 104 the mask removing agent may affect the second mask structure 204 from inside the second opening 204o, e.g. also on the at least one sidewall 204s of the second opening 204o. Therefore, errors, e.g. arising from remaining material from the second mask structure 204, may be avoided.

FIG. 3D illustrates a layer stack in a method according to various embodiments in a schematic cross sectional view or schematic top view (e.g. in a view direction perpendicular to the surface 111, e.g. in a projection on the surface 111) in a step 300d during at least one of a first lift-off process and the second lift-off process.

FIG. 4A, FIG. 4B, FIG. 4C, FIG. 4D and FIG. 4E respectively illustrate a layer stack in a method according to various embodiments in a schematic cross sectional view or schematic side view. The surface 111 may include a first region 111a, a second region 111b surrounding the first region 111a and a third region 111c surrounding the first region 111a and the second region 111b. The first region 111a of the surface 111 and the second region 111b of the surface 111 may adjoin each other in a first perimeter 311a. The second region 111b of the surface 111 and the third region 111c of the surface 111 may adjoin each other in a second perimeter 311b.

The first extension 202d may define a lateral extension of the first region 111a of the surface 111. The second extension 204d may define a lateral extension of the second region 111b of the surface 111. The first region 111a of the surface 111 may be covered by the first layer 102. The second region 111b of the surface 111 may be covered by the second layer 104. The third region 111c of the surface 111 may be free of both, the first layer 102 and the second layer 104. The sidewall 102s of the first layer 102 may extend from the first perimeter 311a into a direction away from the surface 111. The sidewall 104s of the second layer 104 may extend from the second perimeter 311b into a direction away from the surface 111.

Figure 4A:
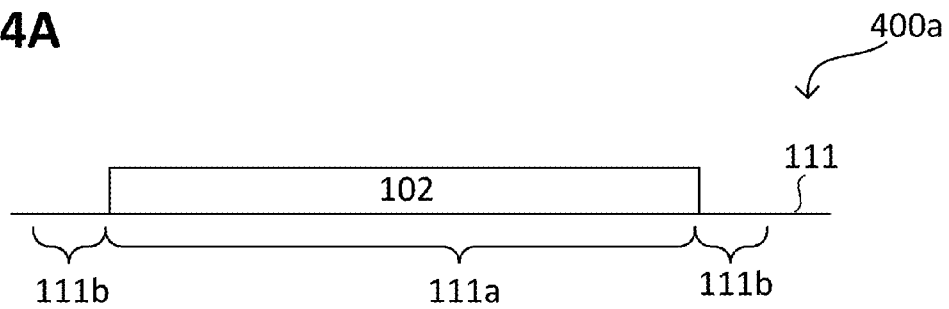
FIG. 4A, FIG. 4B, FIG. 4C, FIG. 4D and FIG. 4E respectively show a layer stack in a method according to various embodiments in a schematic cross sectional view or schematic side view.
Figure 4B:
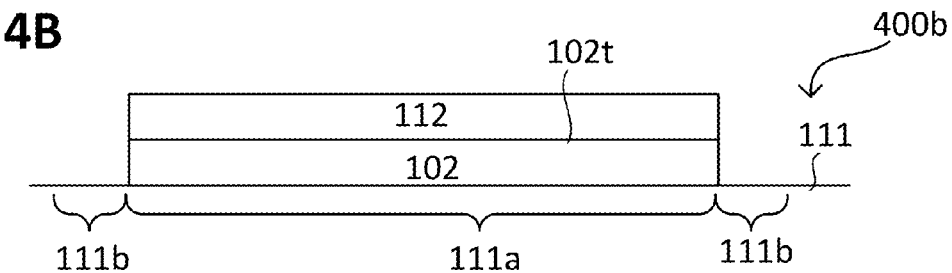
Figure 4C:
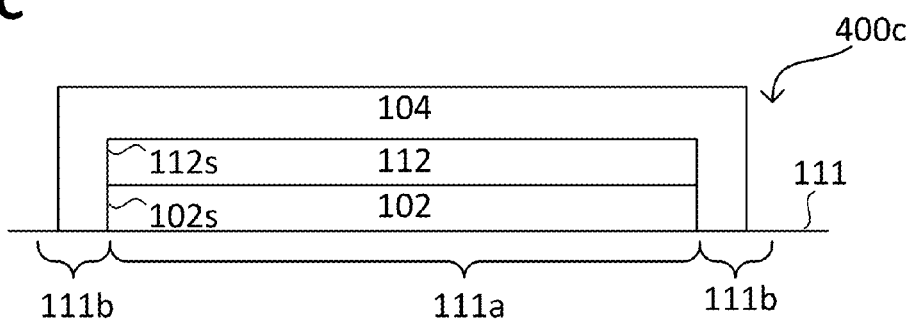

FIG. 4A, FIG. 4B, and FIG. 4C respectively show a layer stack in a method according to various embodiments in a schematic cross sectional view or schematic side view (e.g. in a view direction parallel to the surface 111). The method may include in 400a forming a first layer 102. The method may further include in 400b forming a first further layer 112 over the first layer 102. The first layer 102 and the first further layer 112 may be formed using for both the same process technology (e.g. in using the same process), e.g. in a first lift-off process (e.g. using the same mask structure) or using another process as mentioned before, e.g. using at least one structuring process. Alternatively, the first layer 102 and the first further layer 112 may be formed using different deposition steps, e.g. in at least one of: a first lift-off process, a second lift-off process and one or more other processes (e.g. including one or more structuring processes). For example, the first layer 102 may be formed in a first lift-off process 200a and the first further layer 112 may be formed in a further lift-off process (e.g. similar to the second lift-off process 200b or 200c). In an alternative example, the first layer 102 may be formed in a first lift-off process 200a and the first further layer 112 may be formed using a patenting process (e.g. similar to the first step 100a). In an alternative example, the first layer 102 may be formed in a plating process (e.g. similar to the first step 100a) and the first further layer 112 may be formed in a first lift-off process 200a.

The first layer 102 and the first further layer 112 may both be formed over the first region 111a of the surface 111. The second region 111b of the surface 111 may remain free of the first layer 102 and the first further layer 112.

The method may include in 400c forming a second layer 104. The first further layer 112 (also referred to as third layer 112) may be formed between the first layer 102 and the second layer 104. The second layer 104 may be formed using a lift-off process (e.g. similar to the second lift-off process 200b or 200c). The lift-off process may be configured such that the second layer 104 covers at least one sidewall 102s of the first layer 102 at least partially and at least one sidewall 112s of the third layer 112 at least partially. The third layer 112 may be deposited using a physical vapor deposition (e.g. sputtering or thermal evaporation), e.g. if a lift-off process is used for forming the third layer 112.

According to various embodiments, the third layer 112 covers only a top surface 102t of the first layer 102 at least partially The layer stack including or formed from the first layer 102, the second layer 104 and the third layer 112 may include several material sequences, as among others may be:
(A) the first layer 102 may include or be formed from titan, the second layer 102 may include or be formed from gold, the third layer 112 may include or be formed from platinum;
(B) the first layer 102 may include or be formed from tungsten, the second layer 102 may include or be formed from gold, the third layer 112 may include or be formed from titanium;
(C) the first layer 102 may include or be formed from at least one of tungsten and titanium, the second layer 102 may include or be formed from gold, the third layer 112 may include or be formed from gold;
(D) the first layer 102 may include or be formed from at least one of tungsten and titanium, the second layer 102 may include or be formed from aluminum, the third layer 112 may include or be formed from gold;
(E) the first layer 102 may include or be formed from at least one of tungsten and titanium, the second layer 102 may include or be formed from gold, the third layer 112 may include or be formed from chromium.

According to various embodiments, in the material sequences (A) to (E) gold may be replaced by or mixed with other noble metals, e.g. at least one (one or more than one) of platinum, iridium, palladium, osmium, silver, rhodium, and ruthenium. Alternatively or additionally, in the material sequences (A) to (E), at least one of tungsten, chromium and titanium may be replaced by or mixed with other non-noble metals, e.g. at least one of titanium, copper, niobium, and tantalum.

Forming a layer including aluminum on a layer including gold may result in interface of gold and aluminum including or formed from of an intermetallic compound of gold and aluminum. Other interfaces of two layers may also include or be formed from other intermetallic compounds including metals of the two layers.

According to various embodiments, a noble metal may be understood as metallic element (chemical element) with an electric potential (measured against a standard hydrogen electrode) greater than or equal to about 0.455 V (in other words, greater than the electric potential of ruthenium), e.g. greater than or equal to about 0.79 V, and smaller than about 4 V, e.g. smaller than about 2 V. According to various embodiments, a noble metal may be understood as metallic element (chemical element) with an electric potential (measured against a standard hydrogen electrode) smaller than about 0.455 V, e.g. smaller than or equal to about 0.3 V, e.g. smaller than or equal to about 0.2 V, e.g. smaller than or equal to about 0.1 V, e.g. e.g. smaller than or equal to about 0.3 V, and greater than about −4 V, e.g. greater than about −2 V.

Illustratively, the first layer 102 may be an adhesion layer, wherein the third layer 112 may be a barrier layer and wherein the second layer 104 may be at least one of a solderable layer and a bondable layer. Alternatively, the first layer 102 may be barrier layer, wherein the third layer 112 and the second layer 104 may be at least one of a solderable layer and a bondable layer, e.g. including or made from the same material. Alternatively, the first layer 102 may be adhesion layer, wherein the third layer 112 and the second layer 104 may be an at least one of a solderable layer and a bondable layer, e.g. including or made from the same material.

Figure 4D:
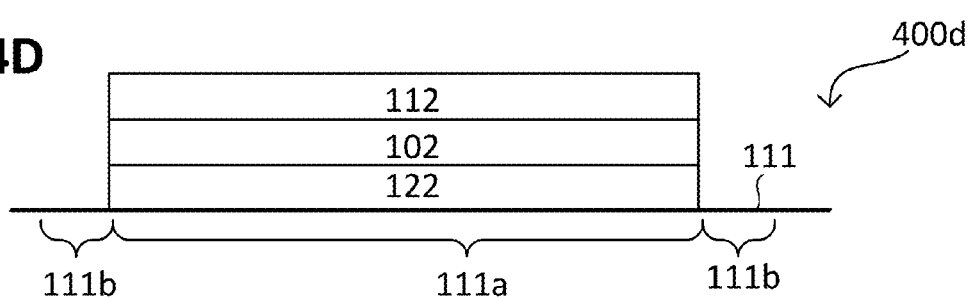
Figure 4E:
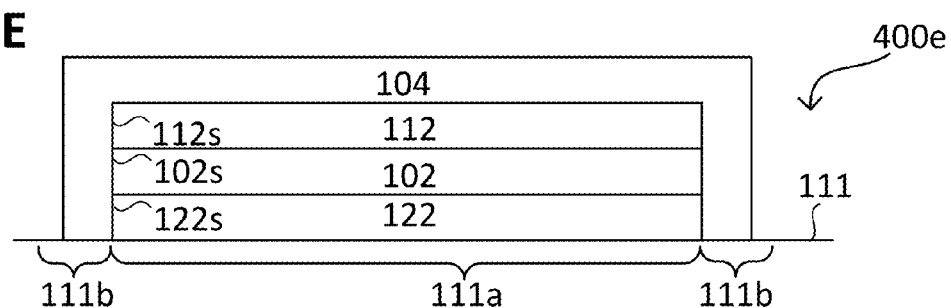

FIG. 4D and FIG. 4E respectively show a layer stack in a method according to various embodiments in a schematic cross sectional view or schematic side view (e.g. in a view direction parallel to the surface 111), e.g. similar as described before. The method may include in 400d forming a second further layer 122 over the surface 111 and forming the first layer 102 over the second further layer 122. The second further layer 122 may also be referred to as fourth layer 122. The method may optionally include in 400b forming the third layer 112 over the first layer 102. The fourth layer 122 may be formed using a physical vapor deposition, e.g. sputtering or thermal evaporation.

The method may include in 400e forming a second layer 112. The optional third layer 112 may be formed between the first layer 102 and the second layer 104 and the fourth layer 122 may be formed between the first layer 102 and the surface. The second layer 104 may be formed using a lift-off process (e.g. similar to the second lift-off process 200b or 200c). The lift-off process may be configured such that the second layer 104 covers at least one sidewall 102s of the first layer 102 at least partially, at least one sidewall 112s of the third layer 112 at least partially and at least one sidewall 122s of the fourth layer 122 at least partially.

At least two of (two or three of) the first layer 102, the third layer 112 and the fourth layer 122 may be formed using the same process technology (e.g. in using the same process), e.g. in a first lift-off process (e.g. using the same mask structure) or using another process as mentioned before, e.g. including at least one structuring process. Alternatively or additionally, at least two of (two or three of) the first layer 102, the third layer 112 and the fourth layer 122 may be formed using different deposition steps, e.g. in at least one of: a first lift-off process, a second lift-off, a third lift-off process and one or more other processes (e.g. including a structuring process).

For example, the third layer 112 may be formed in a first lift-off process 200a and the second layer 104 may be formed in a second lift-off process (e.g. similar to the second lift-off process 200b or 200c). Alternatively or additionally, at least one of the first layer 102 and the fourth layer 122 may be formed using a structuring process (e.g. similar to the second step 100a, 100b or 100c) or using a lift off process (e.g. the first lift-off process 200a). In an alternative example, the first layer 102 may be formed in a first lift-off process and the third layer 112 may be formed in a second lift-off process (e.g. similar to the second lift-off process 200b or 200c). Alternatively or additionally, at least one of the fourth layer 122 and the second layer 104 may be formed using a structuring process (e.g. similar to the second step 100a, 100b or 100c) or using a lift off process (e.g. the first lift-off process 200a).

The layer stack including or formed from the first layer 102, the second layer 104, the third layer 112, and the fourth layer 122 may include several material sequences, e.g. the material sequences (A) to (E), wherein the fourth layer may include or be formed from at least one of titanium, chromium and tungsten. Alternatively or additionally, a material of the fourth layer 122 may be different from a material of the first layer 102. Optionally, the layer stack may include one of the following material sequences:

(F) the first layer 102 may include or be formed from platinum, the second layer 102 may include or be formed from gold, the third layer 112 may include or be formed from gold, the fourth layer 122 may include or be formed from titanium;

(G) the first layer 102 may include or be formed from titanium, the second layer 102 may include or be formed from gold, the third layer 112 may include or be formed from gold, the fourth layer 122 may include or be formed from tungsten;

(H) the first layer 102 may include or be formed from chromium, the second layer 102 may include or be formed from gold, the third layer 112 may include or be formed from gold, the fourth layer 122 may include or be formed from of tungsten or titanium;

(I) the first layer 102 may include or be formed from platinum, the second layer 102 may include or be formed from aluminum, the third layer 112 may include or be formed from gold, the fourth layer 122 may include or be formed from of tungsten or titanium;

According to various embodiments, in the material sequences (F) to (I) gold may be replaced by or mixed with other noble metals, e.g. at least one of platinum, iridium, palladium, osmium, silver, rhodium, and ruthenium. Alternatively or additionally, in the material sequences (F) to (I) at least one of tungsten, chromium and titanium may be replaced by or mixed with other non-noble metals, e.g. at least one of titanium, copper, niobium, and tantalum.

Illustratively, the first layer 102 may be a barrier layer, wherein the third layer 112 and the second layer 104 may be a at least one of a solderable layer and a bondable layer, e.g. including or made from the same material, and wherein the fourth layer may be an adhesion layer. In other words, the layer stack may include two solderable layers or bondable layers, respectively, over each other. According to various embodiments, other combinations may be possible as well, e.g. the third layer 112 may be another barrier or the first layer 102 may be another adhesion layer.

Figure 5A:
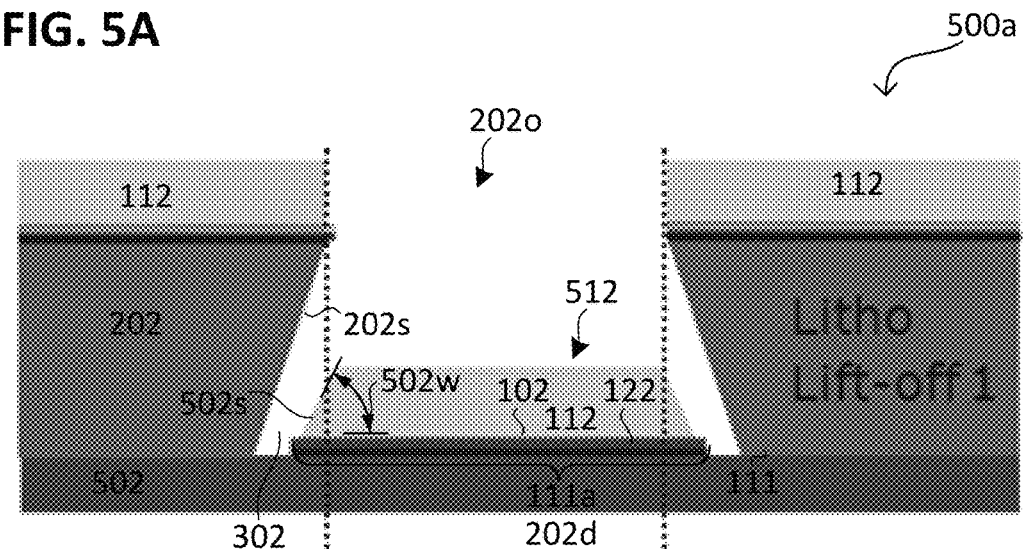
FIG. 5A, FIG. 5B and FIG. 5C respectively show a layer stack in a method according to various embodiments in a schematic cross sectional view or schematic side view.
Figure 5B:
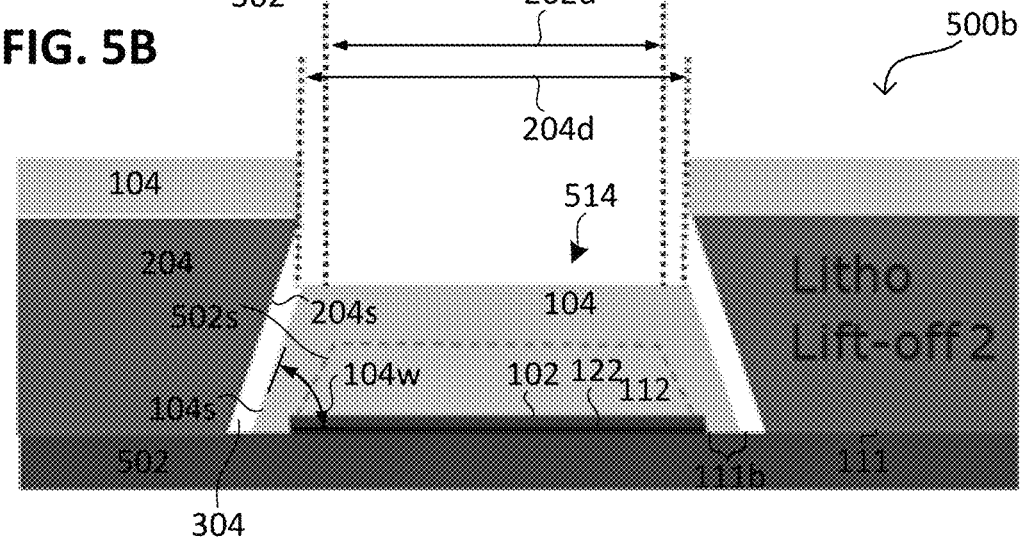
Figure 5C:
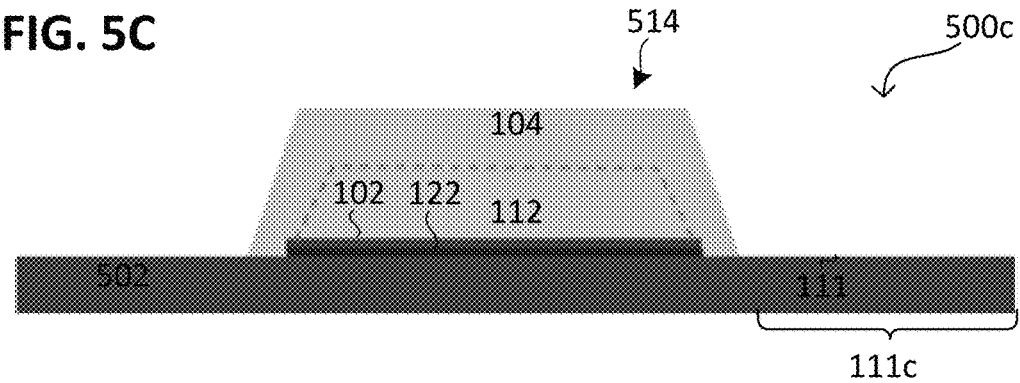

FIG. 5A, FIG. 5B and FIG. 5C respectively show a layer stack in a method according to various embodiments in a schematic cross sectional view or schematic side view (e.g. in a view direction parallel to the surface 111). The method may include in 500a forming a first layer 102, a third layer 112 and a fourth layer 122 in a first lift-off process. In other words, a first layer stack 512 which is formed in the first lift-off process may include or be formed from the first layer 102, the third layer 112 and the fourth layer 122. For the first lift-off process a first mask structure 202 may be provided. Forming at least one of the first layer 102, the third layer 112 and the fourth layer 122 may include disposing material at least one of in the first opening 202o and outside the first opening 202o.

Alternatively, at least the third layer 112 (e.g. the third layer 112 and the first layer 102) may be formed using the first lift-off process and at least one layer, e.g. all remaining layers, of the first layer stack 512 may be formed using one or more other processes (e.g. including a structuring process). In this case, the at least one layer of the first layer stack 512 which is formed using one or more other processes may be present before forming the first mask structure 202. If at least one layer is present before forming the first mask structure 202, the first mask structure 202 may be formed such that the first opening 202o exposes the at least one layer formed using one or more other processes.

According to various embodiments, the first layer 102 may include or be formed from platinum, the third layer 112 may include or be formed from gold (or another noble metal) and the fourth layer 122 may include or be formed from titanium.

The method may in 500a further include to remove the first mask structure 202, e.g. after forming the third layer 112. Removing the first mask structure 202 may include removing material of at least one of the first layer 102, the third layer 112 and the fourth layer 122, which is outside the first opening 202o of the first mask structure 202. Illustratively, the first opening 202o may define the first region 111a of the surface 111. The surface 111 may be a surface of a substrate 502, e.g. a semiconductor substrate.

The first layer stack 512 may include at least one sidewall 502s which is inclined with respect to the surface 111. For example, at least one of the first layer 102, the third layer 112 and the fourth layer 122 may include at least one sidewall which is inclined with respect to the surface 111 by an angle 102w in the range from about 70° to about 85°, e.g. in the range from about 75° to about 80°. For example, at least the first layer 102 may include at least one sidewall 102s which is inclined with respect to the surface 111 by an angle 102w in the range from about 70° to about 85°, e.g. in the range from about 75° to about 80°.

The method may include in 500b forming a second layer 104 using a second lift-off process. For the second lift-off process a second mask structure 204 may be provided. Forming the second layer 104 may include disposing material at least one of in the second opening 204o and outside the second opening 204o. The second layer 104 may cover the at least one sidewall 502s of the first layer stack 512 at least partially. The second layer 104 may include at least one sidewall 104s which is inclined with respect to the surface 111 by an angle 102w in the range from about 70° to about 85°, e.g. in the range from about 75° to about 80°.

The second layer stack 514 may include or be formed the second layer 104 and the first layer stack 512. The first layer stack 512 may include at least the first layer 102 and at least one of the third layer 112 and the fourth layer 122. At least one of the first layer stack 512 and the second layer stack 514 may be part of a semiconductor chip device.

According to various embodiments, forming the first layer stack 512 may include using a first lift-off process for forming at least one layer of the first layer stack 512. Forming the second layer stack 514 may include using a second lift-off process for forming at least one layer of the second layer stack 514. In other words, the second layer stack 514 may optionally include more than one second layer 104. According to various embodiments, the second layer 104 may include or be formed from gold (or another noble metal). Alternatively, the second layer 104 may include or be formed from aluminium.

The method may in 500c include to remove the second mask structure 204. Removing the second mask structure 202 may include removing material of second layer 104 which is disposed outside the second opening 204o. Illustratively, the second opening 202o may define the first region 111a of the surface 111 and the second region 111b of the surface 111. Removing at least one of the first mask structure 202 and the second mask structure 204 may include exposing the third region 111c of the surface 111.

Optionally, the method may in 500c include to form an electrical connection over the second layer stack, e.g. over the second layer 104. The second layer 104 may be in electrical contact to at least one of the second layer 104, the third layer 112 and the fourth layer 122. Therefore, the electrical connection may also be in electrical contact to at least one layer of the second layer stack 514, e.g. to all layers of the second layer stack 514.

According to various embodiments, forming an electrical connection may include disposing a solder material over the second layer 104 and heating the solder material to connect the solder material with the second layer 104. The solder material may include or be formed from at least one of: silver, nickel, tin, aluminum, indium, and lead. For example, the solder material may be a tin based solder material or a lead based solder material.

Alternatively or additionally, forming an electrical connection may include disposing a bonding material over the second layer 104 and pressing the bonding material against the second layer 104 to connect the bonding material with the second layer 104. The bonding material may be formed in wire shape. The bonding material may include or be formed from at least one of: silver, gold, copper, and aluminum. For example, the bonding material may include or be formed from a gold wire, a silver wire or an aluminum wire.

Illustratively, The layer stack including the at least the first layer 102 and the second layer 104 (e.g. the second layer stack 514) may provide good adhesion to the surface 111 and may be robust against environmental influences. Further, the layer stack including the at least the first layer 102 and the second layer 104 includes a solderable surface or bondable surface, respectively, provided by the second layer 104. Further, the layer stack including at least the first layer 102 and the second layer 104 (e.g. the second layer stack 514) may provide good adhesion to the surface 111 and may be robust against environmental influences.

Alternatively or additionally, forming an electrical connection may include disposing an adhesive (e.g. an electrically conductive adhesive) over the second layer 104 and drying the adhesive to connect the adhesive to the second layer 104. The adhesive may include or be formed from a polymer (e.g. an electrically conductive polymer) and may optionally include electrically conductive particles (e.g. metal particles), e.g. in case of an electrically non-conductive polymer.

According to various embodiments, the first layer 102 may include a thickness in the range from about 10 nm to about 5 µm, e.g. in the range from 50 nm about to about 2 µm, e.g. in the range from about 100 nm to about 1 µm. According to various embodiments, the second layer 104 may include a thickness in the range from about 10 nm to about 5 µm, e.g. in the range from 50 nm about to about 2 µm, e.g. in the range from about 100 nm to about 1 µm. According to various embodiments, the third layer 112 may include a thickness in the range from about 10 nm to about 5 µm, e.g. in the range from 50 nm about to about 2 µm, e.g. in the range from about 100 nm to about 1 µm. According to various embodiments, the fourth layer 122 may include a thickness in the range from about 10 nm to about 5 µm, e.g. in the range from 50 nm about to about 2 µm, e.g. in the range from about 100 nm to about 1 µm.

Figure 6A:
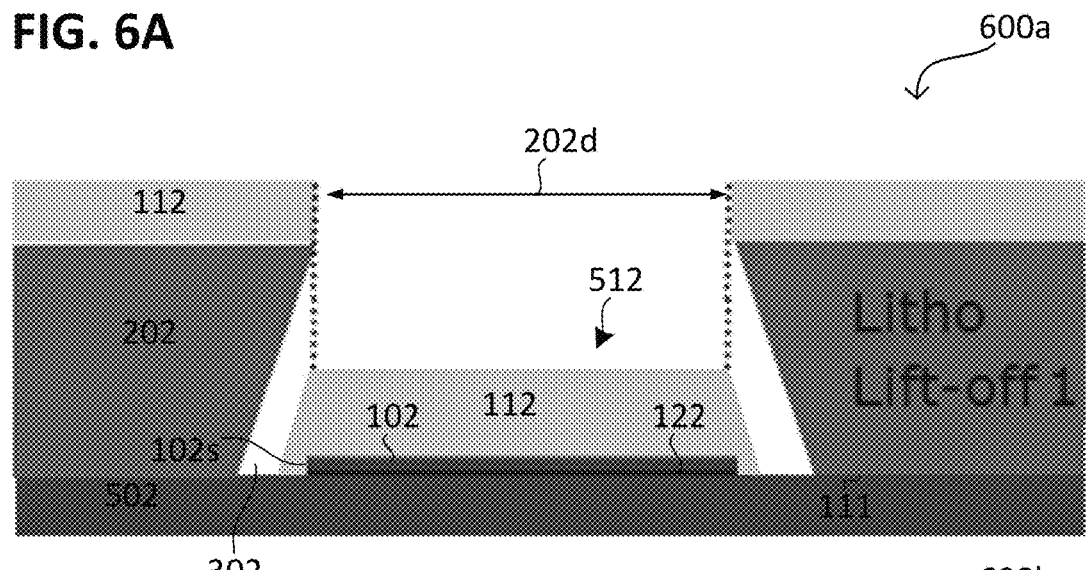
FIG. 6A, FIG. 6B and FIG. 6C respectively show a layer stack in a method according to various embodiments in a schematic cross sectional view or schematic side view.
Figure 6B:
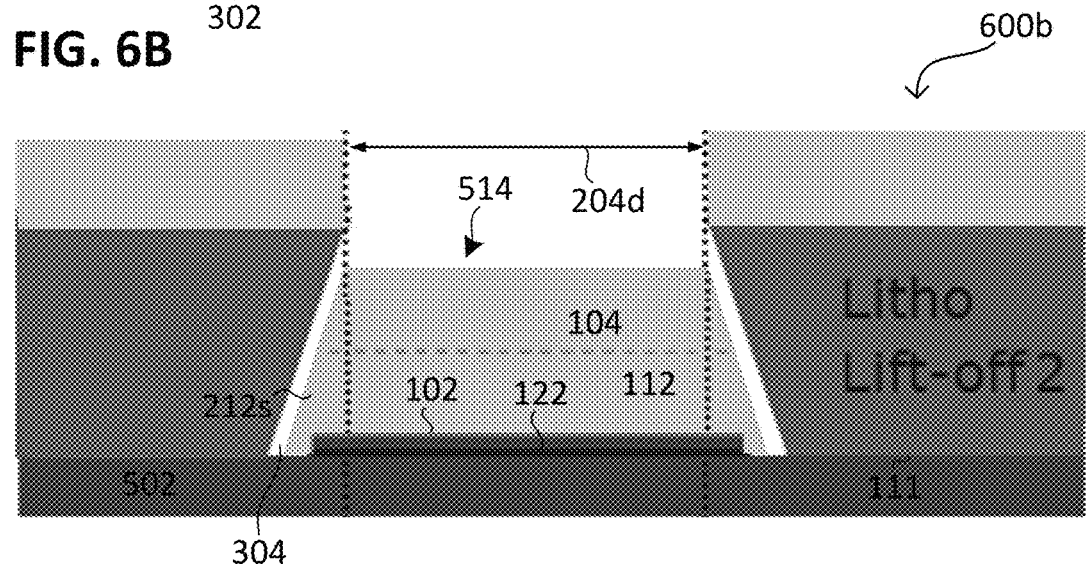
Figure 6C:
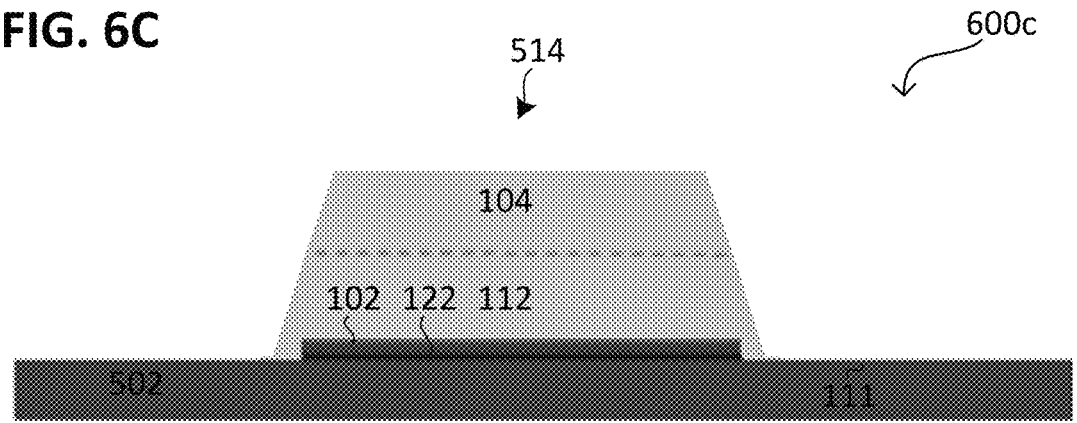

FIG. 6A, FIG. 6B and FIG. 6C respectively illustrate a layer stack in a method according to various embodiments in a schematic cross sectional view or schematic side view (e.g. in a view direction parallel to the surface 111) similar to the methods shown before. The method may in 600a be configured similar to 500a, wherein the first lift-off process is configured such that third layer 112 covers at least one sidewall 102s of the first layer 102. In this case, the method may in 600a include forming the first layer 102 in another process (e.g. including a structuring process) different from a lift-off process or forming the first layer 102 in a lift-off process prior the first lift-off process (e.g. similar to the first lift-off process 200a). Optionally, the method may in 600a include forming a fourth layer 122 in another process (e.g. including a structuring process) different from a lift-off process or forming a fourth layer 122 in a lift-off process prior the first lift-off process (e.g. similar to the first lift-off process 200a). For example, the fourth layer 122, if present, may be formed in the same process like the first layer 102. The first lift-off process may be configured such that third layer 112 covers at least one sidewall of the fourth layer 122, if present.

The method may in 600b be configured similar to 500b, wherein the second lift-off process is configured such that second layer 112 covers the layers formed in 600a. For example, the second layer 104 may be formed over the second layer 104 and over the third layer 112. The second layer 104 may cover a top surface (opposite the surface 111) of the third layer 112, e.g. exclusively cover the top surface (opposite the surface 111) of the third layer 112. In this case, at least one sidewall 112s of the third layer 112 may remain free (uncovered).

The method may in 600c include to remove the second mask structure 204. Optionally, the method may in 600c include to form an electrical connection over the second layer stack 514. Further, various embodiments will be described in the following.

According to various embodiments, a method may include forming a first layer on a surface using a first lift-off process; forming a second layer over the first layer using a second lift-off process; wherein the second lift-off process is configured such that the second layer covers at least one sidewall of the first layer at least partially.

According to various embodiments, the first layer may be formed over a first region of the surface; and the second lift-off process may be configured such that the second layer is formed over a second region of the surface, wherein the second region at least partially surrounds the first region.

According to various embodiments, the first lift-off process may include forming a first mask structure over the surface, wherein the first mask structure may include a first opening exposing the surface; and wherein the second lift-off process may include forming a second mask structure over the surface, wherein the second mask structure may include a second opening exposing the first layer (e.g. at least partially).

According to various embodiments, an extension of the second opening parallel to the surface may be greater than an extension of the first opening parallel to the surface.

According to various embodiments, the first layer may be formed in the first opening and the second layer may formed in the second opening.

According to various embodiments, at least one of the first opening and the second opening may include a tapered shape. In other words, wherein at least one of the first opening and the second opening may include a tapered shape.

According to various embodiments, at least one of the first opening and the second opening may include a sidewall, which is inclined with respect to the surface.

According to various embodiments, an angle between the surface and the sidewall of the at least one of the first opening and the second opening may be in the range from about 70° to about 85°.

According to various embodiments, at least one of the first layer and the second layer may include a tapered shape.

According to various embodiments, at least one of the first layer and the second layer may include a sidewall, which is inclined with respect to the surface.

According to various embodiments, an angle between the surface and the sidewall of the at least one of the first layer and the second layer may be in the range from about 70° to about 85°.

According to various embodiments, the first mask structure may be formed using a first photolithography process; and the second mask structure may be formed using a second photolithography process.

According to various embodiments, the first mask structure may be removed before forming the second mask structure.

According to various embodiments, the second lift-off process may be configured such that the second layer encases the first layer. For example, the second layer may cover the first layer at least in a lateral direction and at least in a vertical direction. The second layer may extend over the first layer in projection to the surface.

According to various embodiments, the first layer may be part of a contact pad. The contact pad may be connected to at least one of a circuit structure, a metallization, and a via connection.

According to various embodiments, the method may further include forming an electrical connection to at least one of the first layer and the second layer, e.g. by electrically contacting the second layer.

According to various embodiments, at least one of the first layer and the second layer may include an electrically conductive material.

According to various embodiments, at least one of the first layer and the second layer may include an electrically insulating material.

According to various embodiments, at least one of the first layer and the second layer may include at least one of the following materials: a metal, an oxide, a carbide, a nitride, and a metal alloy.

According to various embodiments, at least one of the first layer and the second layer may include a noble metal.

According to various embodiments, at least one of the first layer and the second layer may include at least one metal from the following metals (metallic elements): titanium, platinum, tungsten, gold, aluminum, copper, silver, chromium, and palladium.

According to various embodiments, the first layer may include a non-noble metal and the second layer may include a noble metal.

According to various embodiments, the first layer may include at least one metal from the following metals: titanium, chromium, platinum, tungsten; wherein the second layer may include a noble metal.

According to various embodiments, the first layer may include at least one metal from the following metals: titanium, chromium, platinum, tungsten; wherein the second layer may include gold.

According to various embodiments, the first layer may include a noble metal and the second layer may include a noble metal.

According to various embodiments, a material of the first layer may be the same as a material of the second layer. In other words, the first layer and the second layer may include the same material.

According to various embodiments, a metal of the first layer is the same as a metal of the second layer. The metal may be a noble metal, e.g. gold.

According to various embodiments, at least one of the first layer and the second layer may include gold.

According to various embodiments, the first layer may include a noble metal and the second layer may include a non-noble metal.

According to various embodiments, the first layer may include gold and the second layer may include aluminum.

According to various embodiments, the method may further include forming a third layer between the first layer and the second layer using the first lift-off process.

According to various embodiments, the second lift-off process may include forming a second mask structure over the surface, wherein the second mask structure may include a second opening exposing the third layer.

According to various embodiments, the second layer may include a noble metal and the third layer may include a noble metal.

According to various embodiments, a material of the second layer may be the same as a material of the third layer.

According to various embodiments, a metal of the second layer may be the same as a metal of the third layer.

According to various embodiments, at least one of the second layer and the third layer may include gold.

According to various embodiments, the second lift-off process may be configured such that the second layer covers at least one sidewall of the third layer at least partially.

According to various embodiments, the third layer may include a noble metal and the second layer may include a non-noble metal.

According to various embodiments, the third layer may include gold and the second layer may include aluminum.

According to various embodiments, the third layer covers only a top surface of the first layer at least partially.

According to various embodiments, the first layer may include at least one of titanium, chromium, platinum, and tungsten; wherein the second layer may include gold and the third layer may include gold.

According to various embodiments, the method may further include removing material from a surface of the third layer before forming the second layer. For example, removing material may include cleaning the third layer, e.g. from contaminations (e.g. dust) or an oxide layer.

According to various embodiments, the method may further include forming a fourth layer between the surface and the first layer using the first lift-off process.

According to various embodiments, a material of the fourth layer differs from a material of at least one of the first layer and the second layer.

According to various embodiments, the fourth layer may include at least one metal from the following metals: platinum, chromium, titanium, tungsten.

According to various embodiments, the second lift-off process is configured such that the second layer covers at least one sidewall of the fourth layer at least partially.

According to various embodiments, the first layer covers only a top surface of the fourth layer at least partially.

According to various embodiments, the method may further include forming a third layer between the first layer and the second layer using the first lift-off process; and forming a fourth layer between the surface and the first layer using the first lift-off process; wherein the first layer may include at least one of titanium, chromium, and platinum; wherein the fourth layer may include at least one of titanium, chromium, and tungsten; and wherein the second layer may include gold and the third layer may include at least one of gold and aluminum.

According to various embodiments, the first layer and the second layer may be electrically connected with each other. Alternatively or additionally, at least one of the third layer and the fourth layer may be electrically connected with the second layer.

According to various embodiments, the second layer may be in direct physical contact with the at least one sidewall of the first layer. Alternatively or additionally, the second layer may be in direct physical contact with the at least one sidewall of at least one of the third layer and the fourth layer.

According to various embodiments, the third layer may be in direct physical contact with the at least one sidewall of the first layer. Alternatively or additionally, the third layer may be in direct physical contact with the at least one sidewall of the fourth layer.

According to various embodiments, the method may further include removing material from a surface of the first layer before forming the second layer. For example, removing material may include cleaning the first layer, e.g. from contaminations (e.g. dust) or an oxide layer.

According to various embodiments, the method may further include forming at least one further layer over the second layer using a further lift-off process.

According to various embodiments, the further lift-off process may be configured such, that the at least one further layer at least partially covers at least one of: at least one sidewall of the second layer and at least one sidewall of the first layer.

According to various embodiments, the method may further include forming a stack of further layers over the second layer using a sequence of further lift-off processes.

According to various embodiments, the first lift-off process may include forming a first mask structure over the surface, wherein the first mask structure may include a first opening exposing the surface; wherein the first opening may include a sidewall, which is inclined with respect to the surface such that substantially no material of the first layer is deposited on the sidewall of the opening (in other words, the sidewall of the opening is substantially free of material).

According to various embodiments, the second lift-off process may include forming a second mask structure over the surface, wherein the second mask structure may include a second opening exposing the surface; wherein the second opening may include a sidewall, which is inclined with respect to the surface such that substantially no material of the second layer is deposited on the sidewall of the opening.

According to various embodiments, a method may include forming a first layer on a surface; forming a second layer over the first layer using a lift-off process; wherein the lift-off process is configured such that the second layer covers at least one sidewall of the first layer at least partially.

According to various embodiments, forming the first layer may include disposing material of the first layer on the surface and removing the material of the first layer partially, e.g. using etching. According to various embodiments, etching may include or be formed from at least one of dry etching, plasma etching, and wet etching.

According to various embodiments, the lift-off process may include forming a mask structure over the surface, wherein the mask structure may include an opening exposing the first layer (e.g. at least partially); wherein the opening may include a sidewall, which is inclined with respect to the surface such that substantially no material of the second layer is deposited on the sidewall of the opening.

According to various embodiments, the method may further include forming a further layer over the second layer using a further lift-off process.

According to various embodiments the further lift-off process is configured such that the further layer at least partially covers at least one sidewall of at least one of the first layer and the second layer.

According to various embodiments, the second layer may include at least one metal from the following metals: gold, aluminum, copper, silver, chromium, and palladium.

According to various embodiments, the second layer may include a noble metal.

According to various embodiments, a method may include forming at least one first layer on a surface; and covering a sidewall of the first layer at least partially using a lift-off process.

According to various embodiments, a method may include: forming a first layer over a first region using a first lift-off process; and forming a second layer over the first layer and over a second region surrounding the first region using a second lift-off process.

According to various embodiments, a semiconductor chip device may include: a substrate; a contact pad formed over the substrate; wherein the contact pad may include a first layer and a second layer formed over the first layer, wherein the second layer covers at least one sidewall of the first layer (e.g. in a lateral direction) at least partially; and wherein the second layer includes a noble metal.

According to various embodiments, the first layer may include a noble metal.

According to various embodiments, a material of first layer may be the same as a material of the second layer.

According to various embodiments, the semiconductor chip device may further include at least one of a third layer formed between the first layer and the second layer, and a fourth layer formed between the substrate and the first layer.

What is claimed is:

1. A semiconductor chip device, comprising:
   a substrate;
   a contact pad formed over the substrate, wherein the contact pad includes,
      a first layer, and
      a second layer formed over the first layer, wherein the second layer covers at least one sidewall of the first layer at least partially,
   wherein a material of first layer is a material of the second layer.

2. The semiconductor chip device of claim 1, wherein at least one of the first layer and the second layer comprises a noble metal.

3. The semiconductor chip device of claim 1,
   wherein at least one of the first layer and the second layer comprises an electrically conductive material.

4. The semiconductor chip device of claim 1,
   wherein at least one of the first layer and the second layer comprises an electrically insulating material.

5. The semiconductor chip device of claim 1,
   wherein at least one of the first layer and the second layer comprises at least one of: titanium, platinum, tungsten, gold, aluminum, copper, silver, chromium, and palladium.

6. A semiconductor chip device, comprising:
   a substrate;
   a contact pad formed over the substrate, wherein the contact pad includes,
      a first layer,
      a second layer formed over the first layer, wherein the second layer covers at least one sidewall of the first layer at least partially, and
      a third layer formed between the first layer and the second layer;
   wherein the second layer comprises a noble metal and the third layer comprises a noble metal.

7. The semiconductor chip device of claim 6,
   wherein the third layer covers only a top surface of the first layer at least partially.

8. The semiconductor chip device of claim 6, further comprising:
   a fourth layer formed between the substrate and the first layer.

9. The semiconductor chip device of claim 8,
   wherein the third layer is in direct physical contact with the at least one sidewall of the fourth layer.

10. The semiconductor chip device of claim 8,
    wherein at least one of the third layer and the fourth layer is electrically connected with the second layer.

11. The semiconductor chip device of claim 8,
    wherein the second layer is in direct physical contact with the at least one sidewall of at least one of the third layer and the fourth layer.

12. The semiconductor chip device of claim 8,
    wherein the fourth layer comprises at least one of platinum, titanium, chromium, and tungsten; and wherein the second layer comprises gold and the third layer comprises at least one of gold and aluminum.

13. The semiconductor chip device of claim 1,
    wherein the second layer comprises at least one sidewall that is inclined with respect to a surface of the substrate facing the contact pad by an angle in the range from about 70° to about 85°.

14. The semiconductor chip device of claim 13,
    wherein the first layer comprises at least one sidewall that is inclined with respect to a surface of the substrate facing the contact pad by an angle in the range from about 70° to about 85°.

15. The semiconductor chip device of claim 1, wherein the second layer completely covers the least one sidewall of the first layer and further contacts a surface of the substrate facing the contact pad.

16. A semiconductor chip device, comprising:
    a substrate;
    a contact pad formed over the substrate, wherein the contact pad includes,
       a first layer, and a second layer formed over the first layer, wherein the second layer covers at least one sidewall of the first layer at least partially,
wherein the first layer comprises a non-noble metal and the second layer comprises a noble metal.

17. The semiconductor chip device of claim 6,
wherein the second layer covers at least one sidewall of the third layer at least partially.

\* \* \* \* \*